(12) United States Patent
Nyland et al.

(10) Patent No.: US 10,021,808 B1
(45) Date of Patent: Jul. 10, 2018

(54) INTEGRATED BI-DIRECTIONAL CONTROLLED VENT

(71) Applicant: Apple Inc., Cupertino, CA (US)

(72) Inventors: Eric N. Nyland, Santa Clara, CA (US);
Michael Benjamin Wittenberg, Sunnyvale, CA (US); Timothy Y. Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/593,245

(22) Filed: May 11, 2017

Related U.S. Application Data

(60) Provisional application No. 62/399,240, filed on Sep. 23, 2016.

(51) Int. Cl.
  *H05K 7/20* (2006.01)
  *H05K 5/02* (2006.01)

(52) U.S. Cl.
  CPC ....... *H05K 7/20009* (2013.01); *H05K 5/0213* (2013.01); *H05K 5/0217* (2013.01)

(58) Field of Classification Search
  CPC .......... H05K 7/20009; H05K 5/0213–5/0217; H05K 5/068–5/069; F16K 1/30; F16K 1/446; F16K 15/00; F16K 17/00–17/02; F16K 21/04; F16K 24/00; F16K 31/126; H04R 1/02; H04R 1/023; H04R 1/086; H04R 1/2823; H04R 1/2846; H04R 2460/11; G01C 5/06; G06F 1/20; G06F 1/1656; H04M 1/0249; H02G 3/088; F16J 3/046; F16J 15/024; H01L 23/34

USPC ........... 361/691; 73/384; 381/189; 277/457, 277/514, 552, 928; 174/187, 522
See application file for complete search history.

(56) References Cited

U.S. PATENT DOCUMENTS

| | | | | |
|---|---|---|---|---|
| 9,667,297 | B1* | 5/2017 | Miehl | H04B 1/3888 |
| 9,867,312 | B2* | 1/2018 | Lin | H05K 7/20009 |
| 9,888,307 | B2* | 2/2018 | Vitt | H04R 1/086 |
| 2005/0199845 | A1* | 9/2005 | Jones | F16K 15/031 251/129.06 |
| 2008/0254341 | A1* | 10/2008 | Bailey | H01M 8/04089 429/407 |
| 2009/0238496 | A1* | 9/2009 | Liao | B65D 81/052 383/94 |
| 2017/0051769 | A1* | 2/2017 | Hilario | G04B 37/00 |
| 2017/0086321 | A1* | 3/2017 | de Jong | H05K 5/0213 |
| 2017/0089698 | A1* | 3/2017 | Ehman | G01O 5/06 |

* cited by examiner

*Primary Examiner* — Dion R Ferguson
*Assistant Examiner* — Amir Jalali
(74) *Attorney, Agent, or Firm* — Dickinson Wright RLLP

(57) ABSTRACT

A vent assembly in an electronic device is described. The vent assembly may regulate air into and out of the electronic device. The vent assembly may include multiple layers of material bonded together, with each layer having a flap (or flaps) that combines with another flap to form a valve. The vent assembly may include a first layer bonded with a second layer. The first layer includes a first flap, and the second layer includes a second flap that combines with the first flap to form a first valve that regulates air out of the electronic device. The vent assembly can include a third layer. Then, the second layer includes a third flap, and the third layer includes a fourth flap that combines with the third flap to form a second valve that regulates air into the electronic device. In some instances, each valve may permit airflow in one direction.

20 Claims, 10 Drawing Sheets

INTEGRATED BI-DIRECTIONAL CONTROLLED VENT

CROSS REFERENCE TO RELATED APPLICATION(S)

This application claims priority under 35 U.S.C. § 119(e) to U.S. Provisional Patent Application No. 62/399,240, filed Sep. 23, 2016, and entitled "INTEGRATED BI-DIRECTIONAL CONTROLLED VENT," which is incorporated herein by reference in its entirety and for all purposes.

FIELD

The following description relates to a vent in an electronic device. In particular, the following description relates to a vent designed to react quickly to pressure changes in an electronic device in order to equilibrate the electronic device in relatively short time. The vent can open or close based upon air passing through the vent.

BACKGROUND

An electronic device may include a vent that allows air into or out of an electronic device. The vent can include a membrane formed from a porous material, thereby allowing air to permeate through the material. In some instances, the porous material also provides a barrier to water, and the electronic device may resist entry of the water.

However, in some instances, the air cannot escape the electronic device quickly enough through the porous material without disrupting another internal component of the electronic device. For example, an electronic device having a speaker module may include a diaphragm or membrane that is relatively thin and sensitive to pressure changes. When the diaphragm is exposed to internal air of the electronic device, changes in pressure of the internal air can cause unwanted vibrations to the diaphragm, causing the speaker module to generate noise. Also, depressing a touch screen, which causes the touch screen and a cover glass to bend, can reduce the internal volume of the electronic device, thereby increasing the air pressure. This may be particularly noticeable in water-resistant electronic devices that air substantially sealed to prevent water ingress. These water-resistant electronic devices may include a water-resistant membrane that impedes air movement (out of the electronic device) during an air pressure increase in the electronic device. Furthermore, when the touch screen is no longer depressed, both the touch screen and the cover glass return to their original (unbent) configuration, causing the internal volume to increase, thereby decreasing the air pressure. This process can also cause unwanted vibrations to the diaphragm. Accordingly, the water-resistant membrane may provide a relatively slow response time in removing air (in the case of decreased internal volume), and also in receiving air (in the case of increased internal volume).

In order to improve the response time, the size of the membrane may increase, thereby increasing the number of pores of the porous material, and/or increasing the size of each of the pores. However, the increased number of pores or increases size of the pores may decrease the water-resistant capabilities of the membrane, allowing water to enter the electronic device and potentially damage an internal component(s).

SUMMARY

In one aspect, a vent assembly for regulating air within an electronic device is described. The electronic device may include an enclosure that defines an internal volume that carries the air at an internal air pressure. The enclosure may further include a through hole that provides a passage between the air internal volume and an ambient environment that is external to the electronic device. The ambient environment may include an external air pressure. The vent assembly may include a first layer disposed in the internal volume. The first layer may include a first flap and an opening. The vent assembly may further include a second layer disposed in the internal volume and bonded with the first layer. The second layer may include a second flap. The vent assembly may further include a valve formed from the first flap and the second flap. In some instances, the first flap is held together with the second flap by a compressive force defining a closed state of the valve. Further, in some instances, a difference between the internal air pressure and the external air pressure that is greater than the compressive force causes the first flap to separate from the second flap defining an open state of the valve. The open state may allow the air to pass from the internal volume to the ambient environment.

In another aspect, an electronic device is described. The electronic device may include an enclosure that defines an internal volume that carries internal air. The enclosure may include through hole. The electronic device may further include a vent assembly positioned in the internal volume and covering the through hole. The vent assembly may include a first valve that regulates the internal air exiting the enclosure. The vent assembly may further include a second valve that regulates external air entering the enclosure via the through hole.

In another aspect, a method for forming a vent assembly in an electronic device is described. The electronic device may include an enclosure that includes a through hole. The method may include bonding a first layer with a second layer. The first layer may include a first flap and an opening. The second layer may include a second flap. The method may include forming a valve from the first flap and the second flap. The valve is designed to open when air in the enclosure undergoes a pressure increase and enters the opening to allow the air to exit the enclosure via the through hole.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
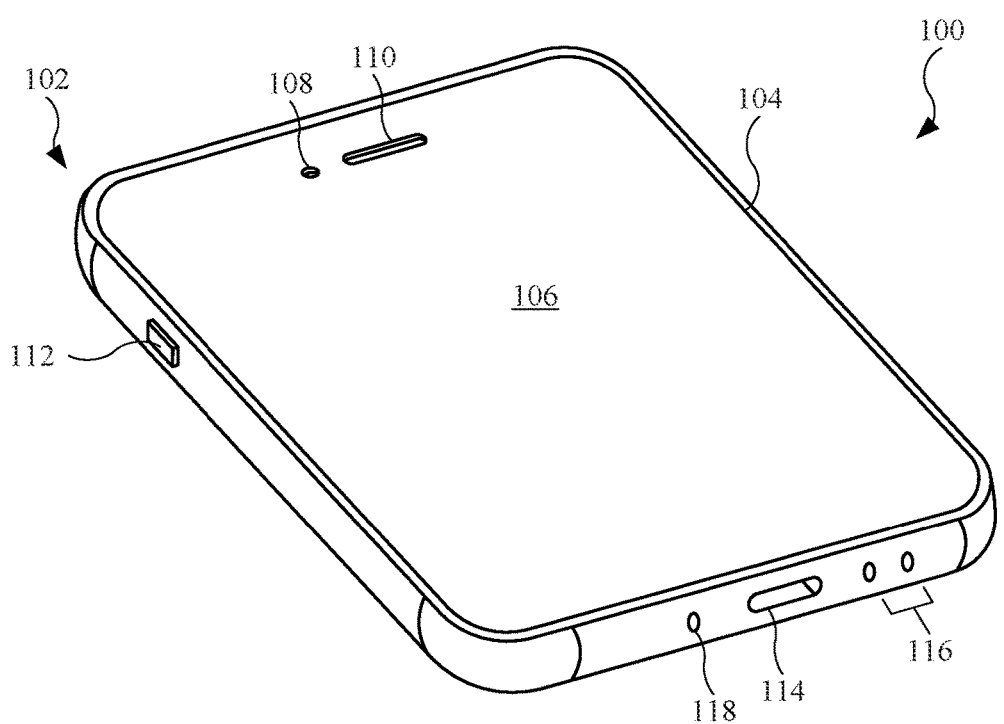
FIG. 1 illustrates an isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a vent assembly for regulating media (such as air) in an electronic device. In particular, the vent assembly is designed to regulate airflow in at least two different directions. In this regard, the vent assembly can include at least two valves. Further, each valve can be designed to permit airflow in one direction but not another (opposite) direction. In this regard, each valve may include characteristics similar to that of a duckbill valve or a check valve designed to prevent "backflow" of the medium.

When positioned in an electronic device, the vent assembly is designed to provide a relatively quick purge of air of out an internal volume defined by the electronic device. For example, the electronic device may include a touch screen designed to receive a touch input to control or alter what is displayed on the touch screen. When a user depresses the touch screen, the user may apply a depression force to the touch screen that causes the touch screen (and/or a transparent protective layer covering the touch screen) to bend or deform, thereby causing the internal volume of the electronic device to decrease. As a result, the volume of the air (inside the electronic device) may abruptly decrease, which in turn, causes the pressure of the air to abruptly increase. However, the increased air pressure can trigger a first valve of the vent assembly to quickly open, allowing the air to exit an opening, or through hole, of the electronic device. As a result, the pressure inside the electronic device quickly decreases and equilibrates with ambient, or environmental, air pressure that is outside, or external to, the electronic device. The "increased air pressure" may refer a difference in pressure (or differential pressure) between the air pressure inside the electronic device and the air pressure outside the electronic device. In particular, the first valve is designed to open when the air pressure inside the electronic device is sufficiently greater than the air pressure outside the electronic device.

The depression force is removed from the touch screen when the user no longer touches the touch screen (or the transparent protective layer), and the touch screen quickly returns to its original unbent configuration. As a result, the internal volume of the electronic device quickly increases and returns to its original internal volume, causing a sudden increase in the air volume (in the electronic device) and a sudden decrease in the air pressure (in the electronic device). However, due in part to the dual-valve design of the vent assembly, the decreased air pressure in the electronic device may cause a second valve to open, allowing ambient air to enter the electronic device so that the air pressure in the electronic device can quickly equilibrate with ambient air pressure. The "decreased air pressure" may again refer a difference in pressure (or differential pressure) between the air pressure inside the electronic device and the air pressure outside the device. In particular, the second valve is designed to open when the air pressure outside the electronic device is sufficiently greater than the air pressure inside the electronic device. In some instances, the first valve may only permit air to exit the electronic device, and the second valve may only permit air to enter the electronic device. By having two fast-reacting valves, the vent assembly can quickly adjust the air pressure inside the electronic device so that sensitive internal components (such as a speaker or receiver) of the electronic device are not significantly affected or disturbed. Also, due to the nature of each valve allowing air passage in one direction, each valve can be designed to prevent air passage in different directions.

The vent assembly may be formed from multiple, generally flat layers of materials. For instance, the vent assembly can include a first layer, a second layer bonded with the first layer, and a third layer bonded with the second layer. Further, each layer may undergo a cutting operation to form one or more flaps, or leafs, with each flap in a layer designed to mate or combine with a flap of another layer to form a valve. Also, the flaps can be cut into the layers in a manner such that the flaps combine to form "one-way" valves, similar to that of a duckbill valve or a check valve, regulating air in different directions. For instance, a first valve of the valve assembly can be designed and positioned in an electronic device to permit air to exit the electronic device, while blocking air (such as ambient or external air) from entering the electronic device. Conversely, a second valve of the valve assembly can be designed and positioned in an electronic device to permit air into the electronic device, while blocking air (such as internal air in the electronic device) from exiting the electronic device. Also, the vent assembly may include openings used to receive air. Accordingly, the valves of the vent assembly may be in communication with at least one of the openings.

The material makeups of layers (and in turn the flaps) can be selected to provide different properties to the valves. Accordingly, the flaps of each valve may include one or more compressive forces designed to hold the flaps together until the compressive forces are overcome. For example, the "spring constant" of a flap, associated with the stiffness of the flap, can be a function of thickness, density, and/or durability of the material. These properties can be selected to create a desired displacement of the flap (or flaps) in response to a predetermine amount of air pressure. Accordingly, the flaps can include a spring constant designed to withstand some air pressure such that the valve remains closed, while allowing a relatively higher air pressure to separate the flaps and open the valve. In other words, the valves, formed by the flaps, can be designed to open in response to a predetermined differential air pressure between the air pressure inside the electronic device and the air pressure outside the electronic device. Furthermore, each pair of flaps that form a valve may contact one another, resulting in adhesion forces between the flaps. The adhesion forces may be based in part on the material makeup of the layers. In this regard, the flaps may (non-permanently) adhere to one another to withstand some air pressure such that the valve remains closed, while allowing a relatively high air pressure to separate the flaps apart and open the valve. Accordingly, the material makeup of the valves described herein can affect the ability of the valves to open and close, as the material makeup can influence the spring constant of the flaps as well as adhesion forces between the material(s) of the flaps. Also, it should be noted that once the differential pressure falls below the predetermined differential pressure, the flaps may come together, thereby causing the valve to close such that the valve no longer permits air passage. As an example, when the air pressure inside the electronic device equalizes with, or approximately equalizes with, the ambient air, the flaps come together and the valve closes.

These and other embodiments are discussed below with reference to FIGS. 1-15. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with some described embodiments. In some embodiments, the electronic device 100 is a tablet computer device. In other embodiments, the electronic device 100 includes a wearable electronic device having one or more straps (not) designed to secure the electronic device 100 with an appendage (such as a wrist) of a user. In the embodiment shown in FIG. 1, the electronic device 100 is a mobile communication device, such as a smartphone. In the described embodiments, the electronic device 100 may enable wireless communication in the form of cellular network communication (long-term evolution, or "LTE"), Bluetooth communication (2.4 GHz), and/or wireless local area network (WLAN) communication (2.4 GHz to 5 GHz), as non-limiting examples.

As shown, the electronic device 100 may include an enclosure 102 designed to provide at least part of an internal volume that carries several operational components (not shown), such as circuit boards, processor circuits, memory circuits, microphone, and audio modules (speakers), as non-limiting examples. The enclosure 102 may also carry components such as an internal power supply (battery) that provides electrical current to the operational component. The enclosure 102 may also carry flexible circuits that route the electrical current to one or more operational components. In some embodiments, the enclosure 102 is formed from a metal, such as aluminum or a metal alloy that includes aluminum. However, the enclosure 102 may include a non-metal material makeup, which can include ceramic or plastic, as non-limiting examples. The enclosure 102 may include several sidewalls that combine with a bottom wall to at least partially define the internal volume of the electronic device 100. However, in some embodiments (not shown), the enclosure 102 includes several sidewalls that form a metal band, as well as a rear protective cover that includes a non-metal material, such as glass.

The electronic device 100 may also include a display assembly 104 designed to present visual information in the form of textual information, still images, and/or video information. Although not shown, the display assembly 104 may further include a touch sensitive layer designed to detect a touch input to the display assembly 104 in order to control an output of the display assembly 104. Also, the display assembly 104 may further include a force sensitive layer designed to detect an amount of force exerted on the display assembly 104. The determined amount of force may correspond to a particular input or command to the display assembly 104. For example, different detected amounts of force may correspond to different or distinct commands.

In order to protect the display assembly 104, the electronic device 100 may include a protective layer 106 that covers or overlays the display assembly 104. The protective layer 106 may include a transparent material, including glass or sapphire, as non-limiting examples. Also, when the display assembly 104 includes a touch sensitive layer and/or a force sensitive layer to generate a touch input to the display assembly 104, the protective layer 106 and the display assembly 104 may bend or deform (elastically, without causing damage), causing the internal volume of the electronic device 100 to decrease and the air pressure in the electronic device 100 to increase. This will be further discussed below. The relationship between volume and pressure can be approximated by an equation for the ideal gas law, $$P_1 V_1 = P_2 V_1$$

where $P_1$ and $V_1$ are initial pressure and volume, respectively, and $P_2$ and $V_2$ are final pressure and volume, respectively.

As shown, the protective layer 106 may include openings that facilitate user interaction with the electronic device 100. For example, the protective layer 106 may include a first opening 108 and a second opening 110. The first opening 108 may allow a camera (not shown) of the electronic device 100 to captures an image (or images) through the protective layer 106 via the first opening 108, while the second opening 110 may allow an audio module (not shown) of the electronic device 100 to emit acoustical energy (generated by the audio module) through the protective layer 106 via the second opening 110.

The electronic device 100 may further include a button 112 designed to generate an input or command when depressed. The input may generate an electrical signal received by a processor circuit (not shown) in the electronic device 100, and alter the visual information presented on the display assembly 104. As shown, the button 112 is located along a particular location of the enclosure 102. However, other locations are possible. Also, although not shown, the electronic device 100 may include a switch designed to provide an additional user input function.

Also, the electronic device 100 may further include a data port 114 designed to receive and electrically couple with a cable assembly (not shown). The data port 114 may receive data/communication from the cable assembly, as well as electrical energy to charge an internal power supply (not shown) located in the electronic device 100. Also, the electronic device 100 may include additional openings designed for various user interactions. For example, the electronic device 100 may an audio module (not shown) located near openings 116, or through holes, formed in the enclosure 102. The openings 116 allow acoustical energy generated from the audio module to exit the electronic device 100. Also, the electronic device 100 may further include a microphone (not shown) located near an opening 118 formed in the enclosure 102. The microphone may be positioned to receive acoustical energy through the opening 118. In some instances, the electronic device 100 is designed as a water-resistant device that includes a venting system that allows for airflow into and out of the electronic device 100, via the openings 116 and/or the opening 118, while also preventing ingress of liquids into the openings 116 and/or the opening 118. This will be discussed below.

Figure 2:
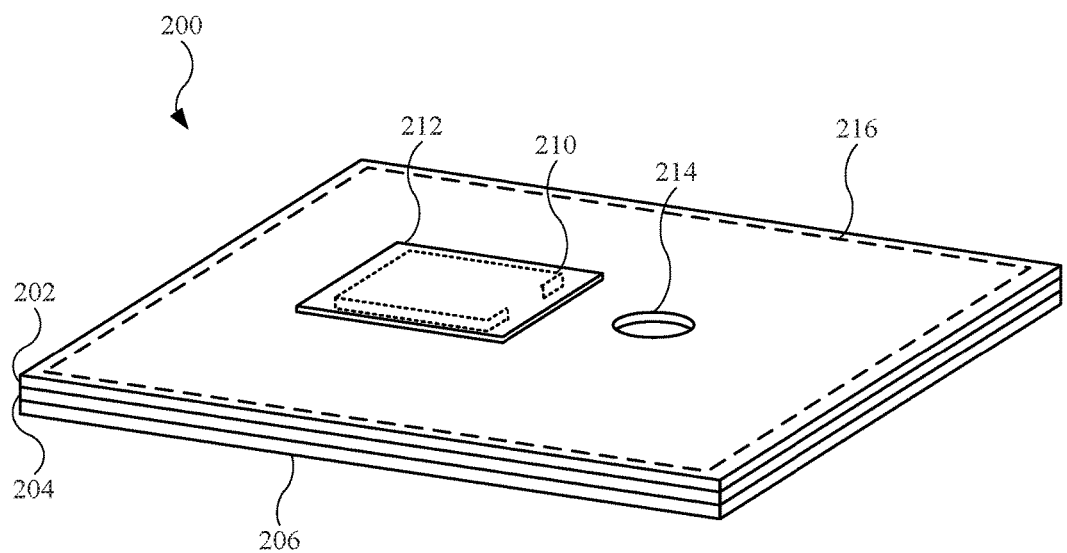
FIG. 2 illustrates an isometric view of an embodiment of a vent assembly, in accordance with some described embodiments.

FIG. 2 illustrates an isometric view of an embodiment of a vent assembly 200, in accordance with some described embodiments. The vent assembly 200 is designed to fit into an internal volume of an electronic device, such as the electronic device 100 shown in FIG. 1. Further, the vent assembly 200 may regulate air into and out of an electronic device, including the openings 116 and the opening 118 (shown in FIG. 1). This will be further discussed below.

The vent assembly 200 may include several layers. For example, as shown, the vent assembly 200 may include a first layer 202, a second layer 204, and a third layer 206. However, in some embodiments, the vent assembly 200 includes two layers. In other embodiments, the vent assembly 200 includes four or more layers. The layers described herein may include one or more types of materials. For example, in some embodiments, each of the layers includes polyimide. In some embodiments, each of the layers includes polyethylene terephthalate ("PET"). In some embodiments, each of the layers includes silicone or a silicone-based material. In some embodiments, each of the layers includes urethane or a urethane-based material. The layers may also include nylon (woven or sheet nylon), or a polycarbonate material. Also, at least some of the layers may include a combination of one or more of the aforementioned materials. Also, the selected material or materials may include air-resistant and water-resistant properties.

As shown, the first layer 202 includes a cutout region that defines a first flap 210 (shown as dotted lines). Accordingly, the first flap 210 may include the same material as that of the first layer 202, and the flaps described herein may include the same material as their respective layers. The vent assembly 200 includes additional layers, which will be shown and described below. A cutting operation used to form the first flap 210 may include laser cutting, die cutting, or a blade, as non-limiting examples. Also, the cutting operation is designed to only partially cut the first layer 202 so as to not remove the first flap 210, and the first flap 210 may be cantilevered to the first layer 202. Also, the cutting operation may allow the first flap 210 to bend, pivot, and/or rotate with respect to the first layer 202. In order to prevent ingress into the vent assembly 200 in a location corresponding to the first flap 210, the vent assembly 200 may include a first cover 212 that covers the first flap 210. The first cover 212 may include an air-resistant and liquid-resistant material, in order to prevent air and liquids from entering an interface region between the first flap 210 and the first layer 202.

However, the vent assembly 200 is designed to allow entry of air in some locations of the vent assembly 200. In this regard, the vent assembly 200 may include a first opening 214 that allows air to enter and exit the vent assembly 200. The vent assembly 200 may include additional openings, which will be shown and described below. Also, in order to bond the layers together and prevent air from flowing through interfaces between the layers of the vent assembly 200, the vent assembly 200 may undergo a bonding operation near an outer perimeter of the layers. For example, as shown, the vent assembly 200 includes a first bond 216 (shown as a dotted line) between the first layer 202 and the second layer 204. The vent assembly 200 may include similar, additional bonds, which will be shown and described below. The bonding operation may include adhesives (including pressure sensitive adhesives, heat activated adhesives), welding (including ultrasonic welding and radio frequency welding), and melting (heat forming), as non-limiting examples. Also, while the first bond 216 is shown as a continuous bond, the bonds described herein may include at least some selected discontinuities that allow air to enter and/or exit the vent assembly 200. In this regard, in some instances, the first opening 214 may not be required, and can be removed.

Figure 3:
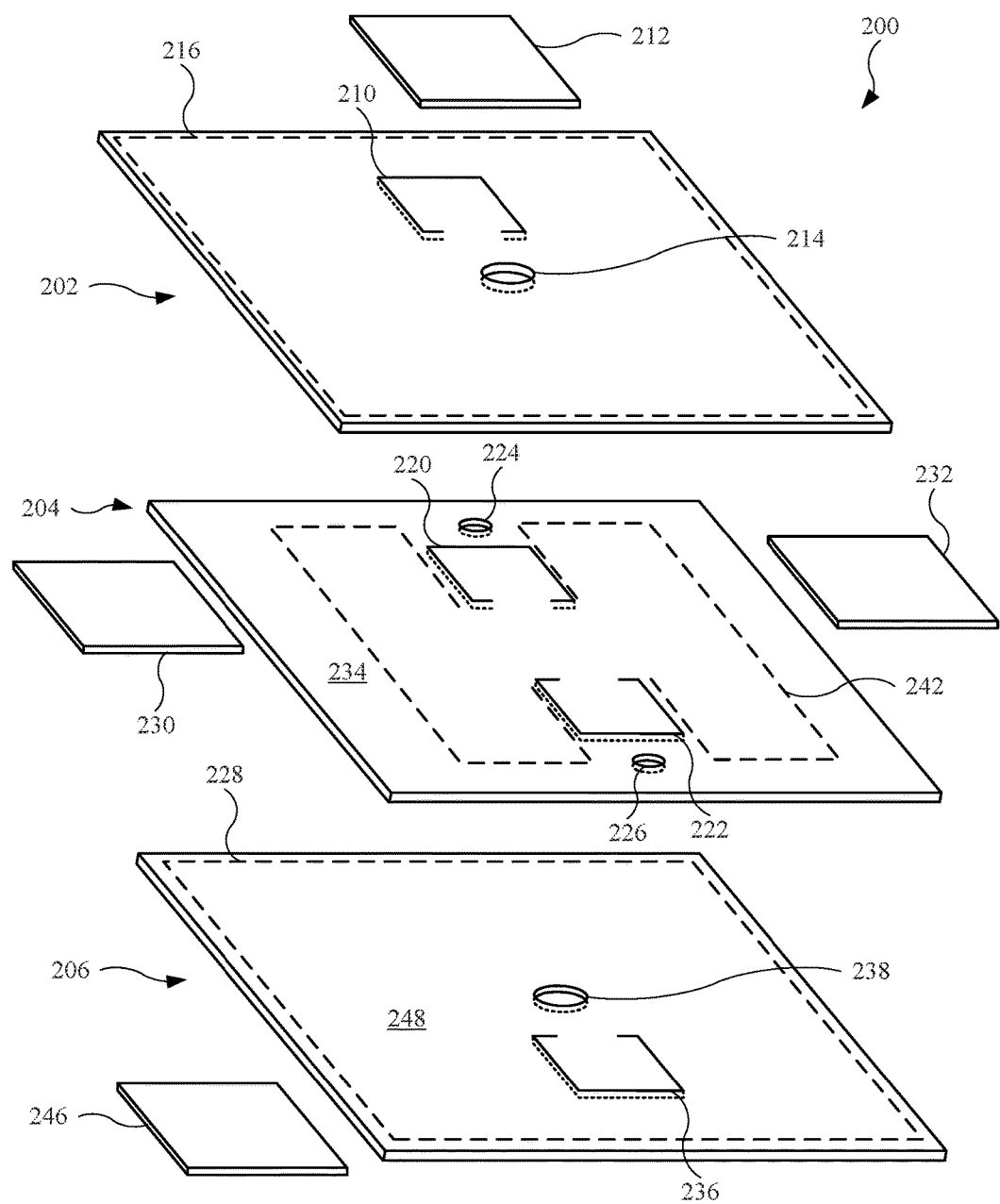
FIG. 3 illustrates an exploded view of the vent assembly shown in FIG. 2, showing various features and components of the vent assembly.

FIG. 3 illustrates an exploded view of the vent assembly 200 shown in FIG. 2, showing various features and components of the vent assembly 200. The features and components of the vent assembly 200 may be included in other embodiments of a vent assembly described herein. As described in FIG. 2, the vent assembly 200 may include a first layer 202, a second layer 204 bonded with the first layer 202, and a third layer 206 bonded with the second layer 204. Also, the first layer 202 includes a first flap 210 covered by a first cover 212, as well as a first opening 214 that allows air into and out of the vent assembly 200. Also, the first layer 202 may bond with the second layer 204 by a first bond 216.

The vent assembly 200 may further include a second flap 220 and a third flap 222, both of which are formed by a cutting operation (previously described) to the second layer 204. When the vent assembly 200 is assembled, the first flap 210 may combine with the second flap 220 to form a first valve (not labeled) designed to regulate air into and out of the vent assembly 200. This will be shown and described below. The vent assembly 200 may further include a second opening 224 formed in the second layer 204. In some instances, the second opening 224 may allow air passing through the first valve to further pass through the second layer 204 when the first valve is open. This will be shown and described below.

Also, the vent assembly 200 may further include a second cover 230 and a third cover 232 designed to overlay the second flap 220 and the third flap 222, respectively. The second cover 230 and the third cover 232 may include any material, and may include any function, previously described for the first cover 212. Also, the second layer 204 includes a first surface 234 and a second surface (not shown) that is opposite the first surface 234. The second cover 230 may overlay the second flap 220 on the second surface of the second layer 204, while the third cover 232 may overlay the third flap 222 on the first surface 234.

The vent assembly 200 may further include a fourth flap 236 formed in the third layer 206 by a cutting operation (previously described). The fourth flap 236 may combine with the third flap 222 (of the second layer 204) to form a second valve (not labeled) designed to regulate air into and out of the vent assembly 200. The vent assembly 200 may further include a third opening 226 formed in the second layer 204 that allows air received by a fourth opening 238 of the third layer 206 to also pass through the second layer 204 when the second valve is open. This will be further shown and discussed below. Also, the vent assembly 200 may further include a fourth opening 238 formed in the third layer 206. The fourth opening 238 may allow air to enter and exit the vent assembly 200. A second bond 228 is shown on the third layer 206, and may be used to bond the third layer 206 with the second layer 204. The bonding operation for the second bond 228 may include any bonding operation previously described for the first bond 216. Also, a fourth cover 246 may be used to cover the fourth flap 236. The fourth cover 246 may include any material, and may include any function, previously described for the first cover 212. Also, the third layer 206 includes a first surface 248 and a second surface (not shown) that is opposite the first surface 248. The fourth cover 246 may overlay the fourth flap 236 on the second surface of the third layer 206.

Each of the first valve and the second valve of the vent assembly 200 may act as a one-way valve designed to allow airflow in a single direction. Generally, the first valve may be designed to regulate air in one direction, while the second valve is designed to regulate air in an opposite direction (as compared to the direction allowed by the first valve). As an example, the first valve may allow air to pass through the vent assembly 200 (provided there is sufficient differential air pressure to open the first valve) in a first direction, while preventing air passing from passing through the first valve in a second direction (opposite the first direction) regardless of the differential air pressure. Similarly, the second valve may allow airflow to pass through the vent assembly 200 (provided there is sufficient differential air pressure to open the second valve) in the second direction, while preventing air passing from passing through the second valve in the first direction regardless of the differential air pressure. This will be shown and described below.

Also, in order to direct air through the vent assembly 200 in a desired manner, the vent assembly 200 may include additional bonds. For example, a third bond 242, shown on the second layer 204, is designed to bond the first layer 202 with the second layer 204. This may direct air entering the vent assembly 200 to the aforementioned valves so that the airflow does not flow around the valves. Also, the aforementioned covers may direct air toward the valves and prevent air from flowing around the valves.

Figure 4:
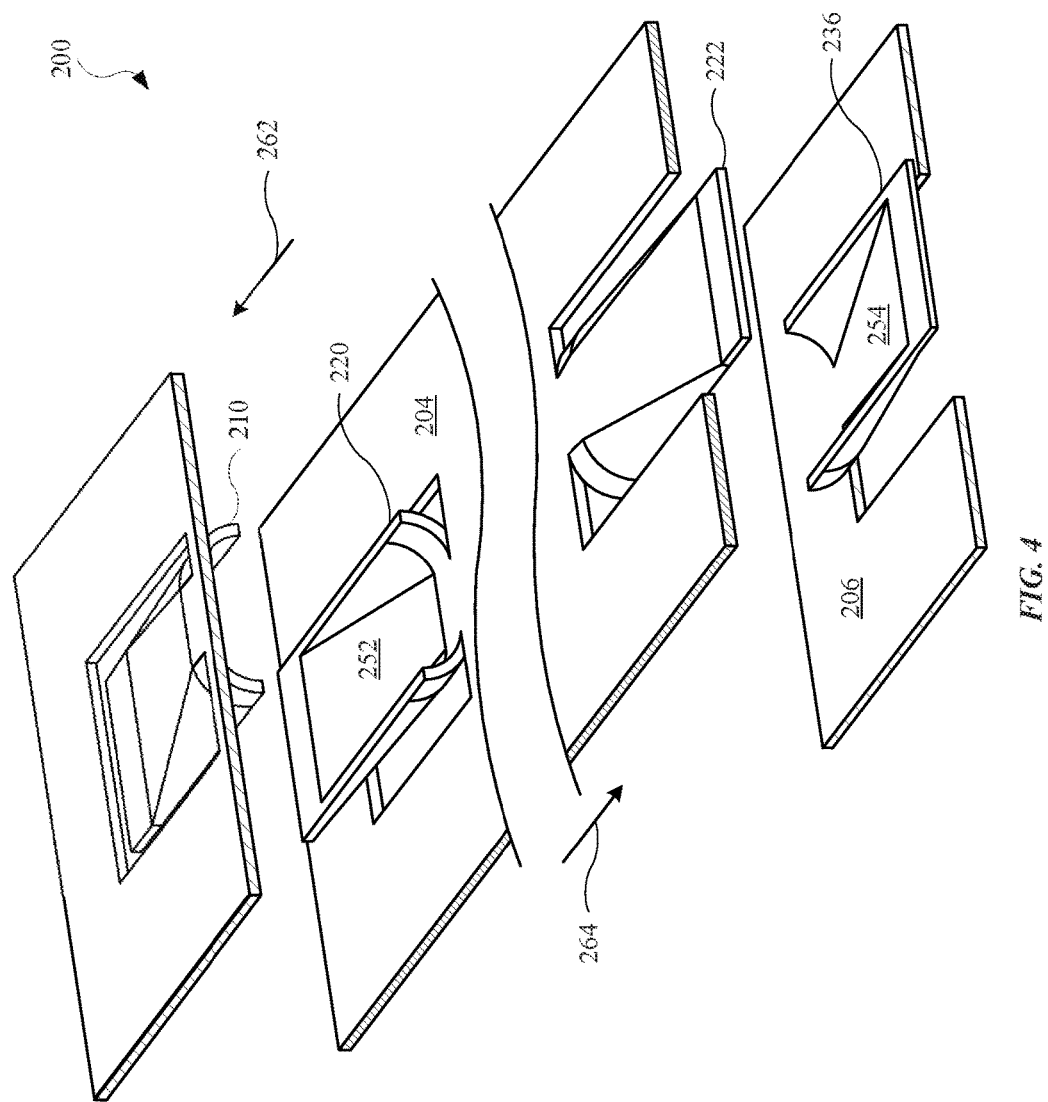
FIG. 4 illustrates a partial cross sectional view of the vent assembly, showing the layers having cutout regions to form the flaps.

FIG. 4 illustrates a partial cross sectional view of the vent assembly 200, showing the layers having cutout regions to form the flaps. For instance, the first flap 210, cut out from the first layer 202, is designed to combine and couple with the second flap 220, cut out from the second layer 204, to form a first valve, and the third flap 222, cut out from the second layer 204, is designed to combine and couple with the fourth flap 236, cut out from the third layer 206, to form a second valve. Each flap includes an associated surface area over which the air may flow. For example, the second flap 220 includes a surface area defined by a surface 252 (of the second flap 220), with the surface 252 generally including a U-shape as shown in FIG. 4. The second flap 220 is designed and positioned to receive air in a first direction 262. Also, the first flap 210 may include a surface (not shown) similar to the surface 252 of the second flap 220. Accordingly, the first flap 210 may include a surface having a similar surface area as that of the surface 252. The first valve (formed by the first flap 210 and the second flap 220) may regulate airflow in the first direction 262. The fourth flap 236 includes a surface defined by a surface 254 that also generally includes a U-shape. The fourth flap 236 is designed and positioned receive air in a second direction 264 that is opposite the first direction 262. Also, the third flap 222 may include a surface (not shown) similar to the surface 254 of the fourth flap 236. Accordingly, the third flap 222 may include a surface having a similar surface area as that of the surface 254, and the second valve (formed by the third flap 222 and the fourth flap 236) may regulate airflow in the second direction 264.

Once the valves are assembled, the force required to open the valves may be a function of the differential pressure (the difference in air pressure) on each side of the valve and the surface area of the flaps that form the valves. Accordingly, the required force is proportional to the surface area, and changes to the size of the flap can change the required opening force. Also, although the cutout region of each of the flaps generally includes a rectilinear design, the cutout region can include different shapes, such as a tapered region.

Each flap may include a spring constant that is a function of the material makeup and thickness of the flap, and a force that holds the flaps together may be a function of the spring constant. Also, when the flaps are in contact with one another, adhesion forces between the flaps may maintain the flaps together. Like the spring constant, the adhesion forces may be associated with the material makeup of the flaps. These forces may be referred to as the forces that hold the flaps together. Accordingly, the force required to open the valves (i.e., separate the flaps) must overcome the force associated with the spring constant and the adhesion forces. This will be discussed below.

Figure 5:
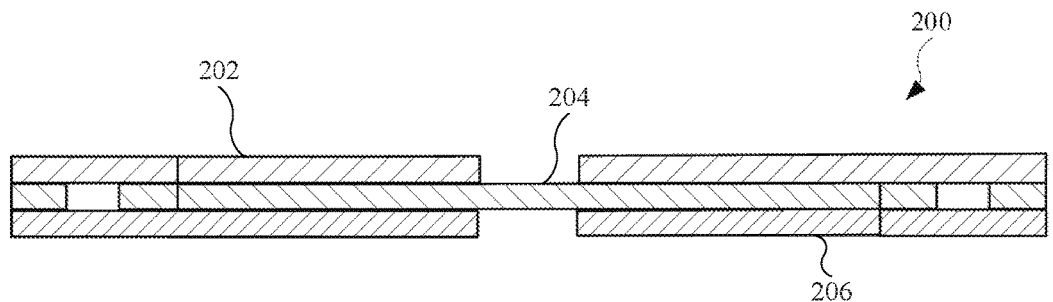
FIG. 5 illustrates a cross sectional view of the vent assembly shown in FIG. 4, showing the vent assembly in a closed configuration.

Despite the flaps having a curved, or U-shaped, configuration, the flaps may initially be flat or planar. For example, FIG. 5 illustrates a cross sectional view of the vent assembly 200 shown in FIG. 5, showing the vent assembly 200 in a closed configuration. The "closed configuration" may refer to the layers being in contact with one another. For example, as shown in FIG. 4, the first layer 202 is resting on the second layer 204, and the second layer 204 is resting on the third layer 206. The closed configuration of the vent assembly 200, and other vent assemblies described herein, may occur in steady-state conditions in which no air flows through the vent assembly 200 via the openings of the vent assembly 200. In this regard, the vent assembly 200, when positioned in an electronic device (not shown), may conserve space when not in use, as the layers rest on one another (as opposed to being separated from one another).

Figure 6:
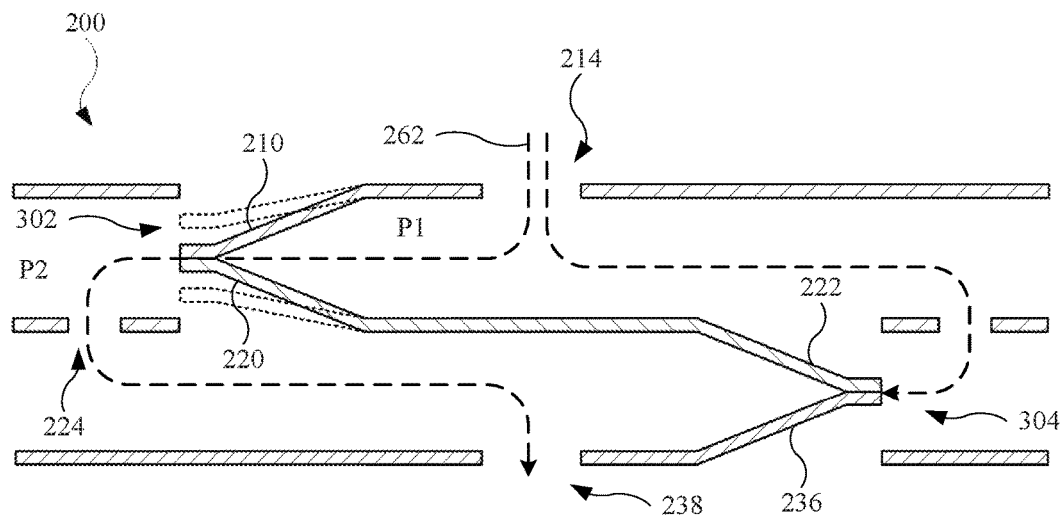
FIG. 6 illustrates a cross sectional view of the vent assembly shown in FIG. 5, showing the vent assembly in an open configuration, with air flowing in a first direction through the vent assembly.

FIG. 6 illustrates a cross sectional view of the vent assembly 200 shown in FIG. 5, showing the vent assembly 200 in an open configuration, with air flowing in the first direction 262 through the vent assembly 200. The "open configuration" may refer to the layers being separated from one another. For example, as shown in FIG. 6, the first layer 202 is separated from the second layer 204, and the second layer 204 is separated from the third layer 206. Air entering the first opening 214 or the fourth opening 238 may cause the vent assembly 200 to change from the closed configuration (shown in FIG. 5) to the open configuration. As shown, air may enter the vent assembly 200 via the first opening 214 and flow in the first direction 262 (denoted by a dotted line) toward a first valve 302 of the vent assembly 200, with the first valve 302 formed from the first flap 210 and the second flap 220.

In order for the airflow to open the first valve 302, the airflow must overcome the forces, also referred to as compressive forces, holding the first flap 210 together with the second flap 220. In this regard, the first flap 210 and the second flap 220 may each include a spring constant, associated with a stiffness of the material (or materials) that form(s) the first flap 210 and the second flap 220, as well as a thickness of the material(s). The force required separate the first flap 210 from the second flap 220 is based in part upon the spring constant of the first flap 210 and the second flap 220. In addition, adhesion forces between the first flap 210 and the second flap 220 may occur, with the adhesion forces based in part upon the material (or materials) that form(s) the first flap 210 and the second flap 220. The force associated with the spring constant and the adhesion force may define the compressive forces that hold the first flap 210 and the second flap 220 together. Accordingly, the force necessary to open the first valve 302 must be greater than the sum of i) the force associated with the spring constant of the first flap 210 and the second flap 220, and ii) the adhesion forces between the first flap 210 and the second flap 220. When the opening force is less than the sum of the forces associated with the spring constant and the adhesion forces, the first valve 302 is in a closed state and remains shut, as shown in FIG. 6. When the opening force is greater than the sum of the forces associated with the spring constant and the adhesion forces, the first valve 302 changes to an open state and the first flap 210 and the second flap 220 separate from each other, as indicated by the dotted lines. When the first valve 302 opens, the air is free to pass through the first valve 302, the second opening 224, and through the fourth opening 238 to exit the vent assembly 200. Also, the "opening force" is associated with a sufficient differential (air) pressure, that is, the difference between the internal pressure, P1, exerted on the first valve 302 and the external pressure, P2, exerted on the first valve 302. As shown, P1 represents the pressure one side of the first valve 302 while P2 represents the pressure on an opposing side of the first valve 302.

When the spring constant of the material and the adhesion forces are known, the force required to open the valves described herein can be calculated. Accordingly, at least one of the spring constant and the adhesion forces can be manipulated to form a valve that opens based upon a calculated and predetermined opening force. In some instances, it may be desirable for the valves to opening rapidly in response to a sudden change in force, such as a chance in air pressure (a function of force) inside an electronic device (not shown). Also, it may be desirable for some air pressure buildup to occur before the required opening force is achieved. This will be discussed below.

Also, the valves of the vent assembly 200 may be designed as "one-way" valves, similar to a duckbill valve or a check valve. For example, FIG. 6 further shows some airflow entering the first opening 214 and flowing in a direction toward a second valve 304 formed from the third flap 222 and the fourth flap 236. The second valve 304, acting as a one-way valve, prevents airflow received by the first opening 214 from passing through the second valve 304. Accordingly, the vent assembly 200 is designed such that air passing through the first opening 214 may be limited to passing only through the first valve 302 and is blocked by the second valve 304.

Figure 7:
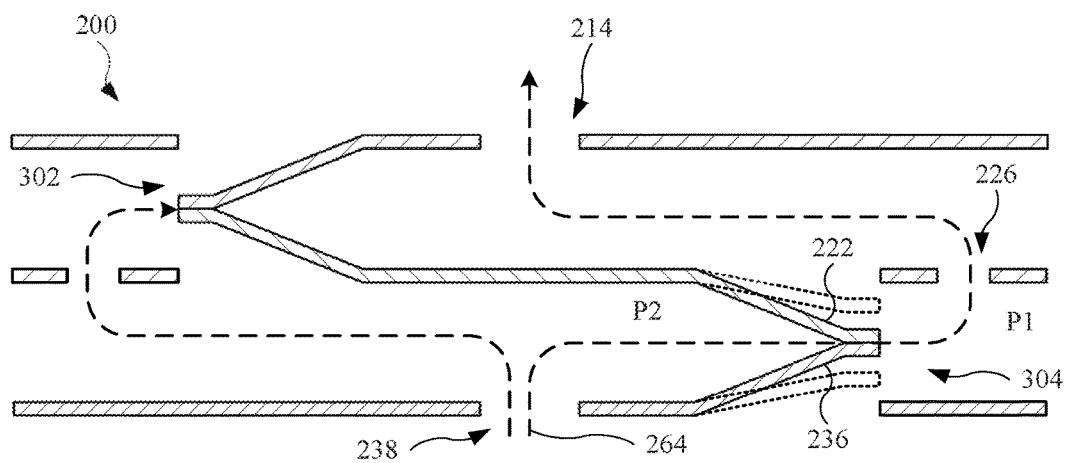
FIG. 7 illustrates a cross sectional view of the vent assembly shown in FIG. 6, showing the vent assembly in the open configuration, with air flowing in a second direction through the vent assembly.

FIG. 7 illustrates a cross sectional view of the vent assembly 200 shown in FIG. 6, showing the vent assembly 200 in the open configuration, with air flowing in a second direction 264 through the vent assembly 200. As shown, air entering the vent assembly 200 via the fourth opening 238 flows in the second direction 264 (denoted by a dotted line) toward the second valve 304. In a manner analogous to that of the first valve 302, the second valve 304 may include holding forces associated with the spring constant of the third flap 222 and the fourth flap 236, as well as adhesion forces between the third flap 222 and the fourth flap 236.

The opening force applied to the second valve 304 by the airflow is a function of the differential (air) pressure, that is, the difference between the external pressure, P2, exerted on the second valve 304 and the internal pressure, P1, exerted on the second valve 304, as well as the (combined) surface area of the third flap 222 and the fourth flap 236. When the opening force is less than the force associated with the sum of the spring constant and the adhesion forces, the second valve 304 is in a closed state and remains shut, as shown in FIG. 7. When the opening force is greater than the sum of the forces associated with the spring constant and the adhesion forces, the second valve 304 is in an open state, and the third flap 222 and the fourth flap 236 separate from each other, as indicated by the dotted lines. When the second valve 304 opens, the air is allowed to flow through the second valve 304, the third opening 226, and then through the first opening 214 to exit the vent assembly 200.

Similar to the second valve 304, the first valve 302 may act as a one-way valve. For example, FIG. 7 further shows some airflow received by the fourth opening 238 flowing toward the first valve 302. The first valve 302 may remain closed to prevent the air from passing through the first valve 302. Accordingly, the vent assembly 200 is further designed such air passing through the fourth opening 238 may be limited to passing only through the second valve 304 and is blocked by the first valve 302.

Figure 8:
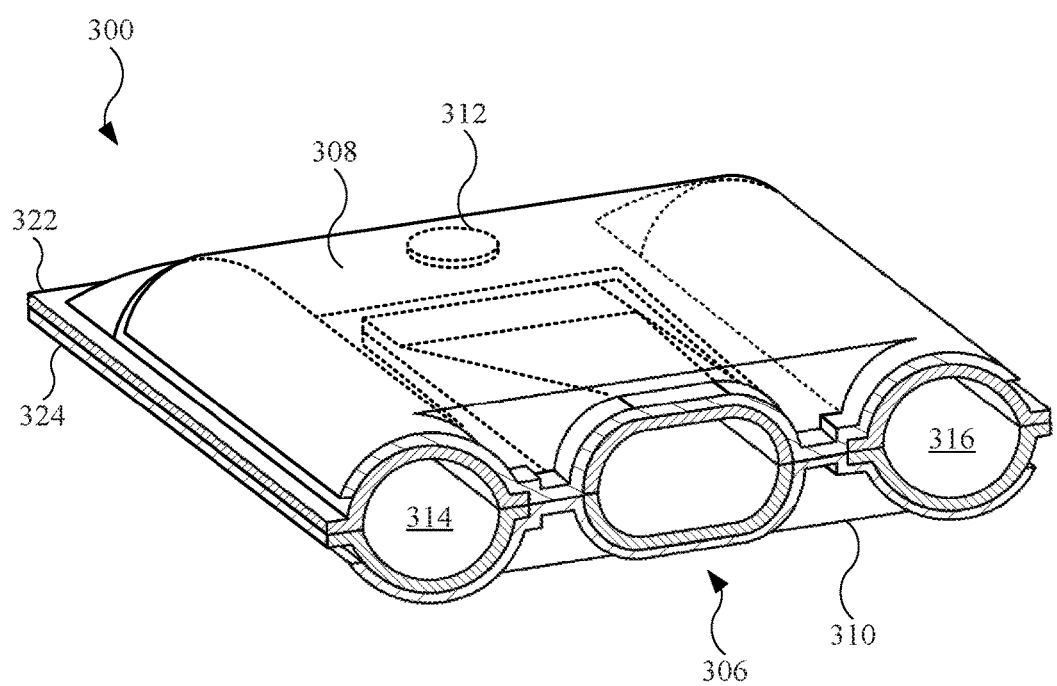
FIG. 8 illustrates a partial cross sectional view of an alternate embodiment of a vent assembly, showing the vent assembly having covers to provide a seal to the layers of the vent assembly, in accordance with some described embodiments.

FIG. 8 illustrates a partial cross sectional view of an alternate embodiment of a vent assembly 300, showing the vent assembly 300 having covers to provide a seal to the layers of the vent assembly 300, in accordance with some described embodiments. The vent assembly 300 may include any materials and features previously described for a vent assembly. As shown, the vent assembly 300 includes a first layer 322 and a second layer 324, with the first layer 322 and the second layer 324 combining to define a valve 306 defined by multiple flaps (in dotted lines, not labeled) in a manner previously described. Also, the vent assembly 300 includes a first cover 308 and a second cover 310, both of which combine to cover the valve 306. As shown, the first cover 308 and the second cover 310 at least partially cover the first layer 322 and the second layer 324, respectively. The vent assembly 300 may further include an opening 312 formed in the second layer 324. When the valve 306 opens, the air passing through the valve 306 may pass through the opening 312.

In order to prevent airflow from circumventing the valve 306 and passing through the opening 312, several additional bonds between adjacent layers may be used (see FIG. 3, for example). When airflow enters the vent assembly 300, the first layer 322 and the second layer 324 separate from one another to form a first bladder 314 and a second bladder 316. These bladders prevent the airflow from circumventing the valve 306. Also, the first cover 308 may seal with the second cover 310 in order further prevent airflow from circumventing the valve 306. In this manner, the air flowing into the vent assembly 300 via an opening (not shown) must provide a sufficient force, and cause a sufficient differential pressure, to open the valve 306 in order to pass through the opening 312. Otherwise, the air may remain in the first bladder 314 and/or the second bladder 316. Although not shown, the described embodiments herein may include at least some of the features described in FIG. 8.

Figure 9:
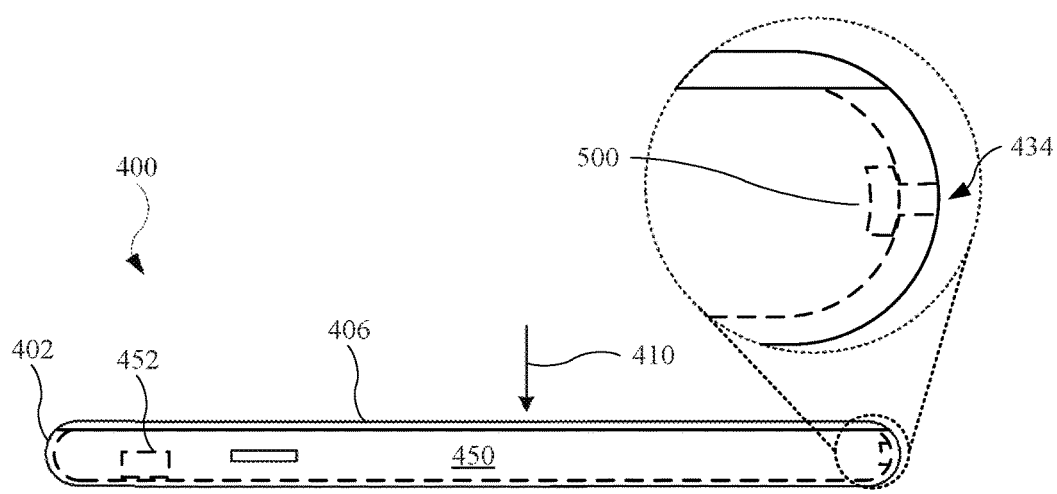
FIG. 9 illustrates a side view of an electronic device that includes a vent assembly designed to regulate air in and out of the electronic device, in accordance with some described embodiments.

FIG. 9 illustrates a side view of an electronic device 400 that includes a vent assembly 500 designed to regulate air in and out of the electronic device 400, in accordance with some described embodiments. Both the electronic device 400 and the vent assembly 500 may include any materials and features previously described for an electronic device and a vent assembly, respectively. However, for purposes of simplicity and illustration, only some features of the electronic device 400 are shown. The electronic device 400 may include an enclosure 402 and a protective layer 406 secured with the enclosure 402. Also, the enclosure 402 may define an internal volume 450 designed to carry several components, such as an internal component 452. As shown in the enlarged view, the vent assembly 500 covers an opening 434, or through hole, formed in the enclosure 402, with the opening 434 providing a passage between air in the internal volume 450 and ambient or environmental air that is external with respect to the electronic device 400. In this manner, the vent assembly 500 is positioned to regulate air into and out of the electronic device 400, and in particular, the internal volume 450.

As shown, a force 410 is applied to the protective layer 406. The force 410 may represent an interaction between a user and a display assembly or touch screen or display assembly (not shown) covered by the protective layer 406. In other words, the force 410 may represent the user depressing the protective layer 406 to provide a touch input to the touch screen to provide a command that alters the contents of the display touch screen. In some instances, the force 410 may cause the protective layer 406 and the display assembly to bend, which causes the internal volume 450 to decrease, thereby decreasing the volume of the air in the electronic device 400 and increasing the pressure of the air in the electronic device 400. This may affect or disturb some components, such as the internal component 452, in the electronic device 400.

Figure 10:
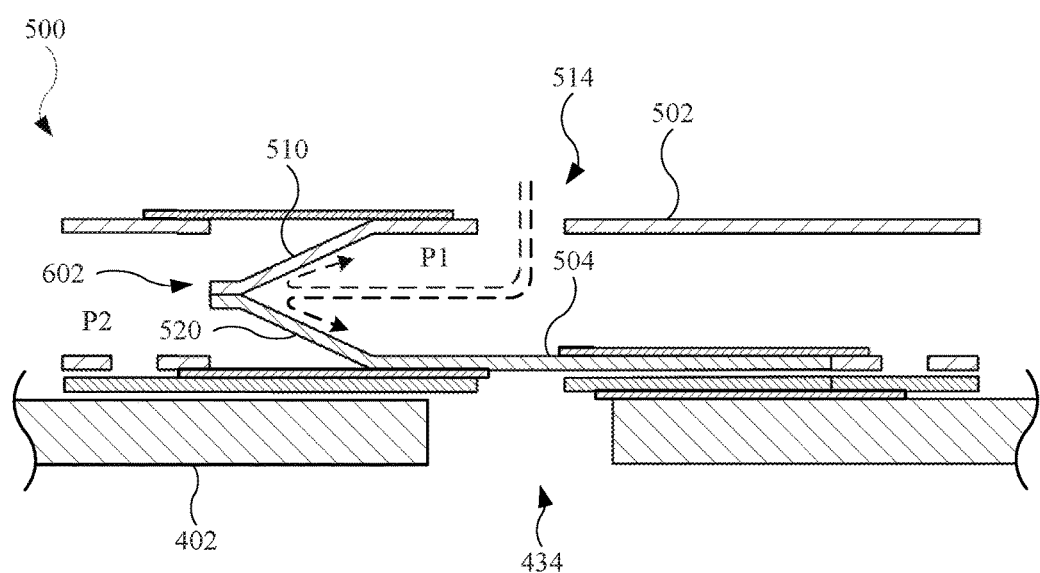
FIG. 10 illustrates a cross sectional view of the vent assembly shown in FIG. 9, showing air entering the vent assembly.

FIG. 10 illustrates a cross sectional view of the vent assembly 500 shown in FIG. 9, showing air entering the vent assembly 500. The vent assembly 500 may include several layers, such as a first layer 502 and a second layer 504. The first layer 502 may include a first flap 510 and the second layer 504 may include a second flap 520, with the first flap 510 combining with the second flap 520 to form a first valve 602, in accordance with some described embodiments. Also, the first layer 502 may include a first opening 514 that allows air from the internal volume 450 (shown in FIG. 9) to enter the vent assembly 500. As shown, the airflow passes through the vent assembly 500 in a direction toward the first valve 602. Air entering the vent assembly 500 may result from the reduced internal volume and increased air pressure of the internal volume 450, caused by the force 410 (shown in FIG. 9) that bends the protective layer 406. However, as shown collectively in FIGS. 9 and 10, the force 410 causes minimal bending to the protective layer 406, and as a result, the increased air pressure in the internal volume 450, resulting from the bending of the protective layer 406, is insufficient to open the first valve 602. In other words, the airflow into the vent assembly 500 does not create a sufficient pressure differential between P1 at one location of the first valve 602, and P2 at another location of the first valve 602, with the locations of the P1 and P2 being on opposing sides of the first valve 602. Accordingly, the force required to open the first valve 602 is less than a sum of the force of the spring constant and the adhesion forces, with the spring constant and the adhesion forces being defined by of the material makeup of the first flap 510 and the second flap 520. As shown in FIG. 10, the air does not exit the vent assembly 500 through the opening 434 of the enclosure 402.

Figure 11:
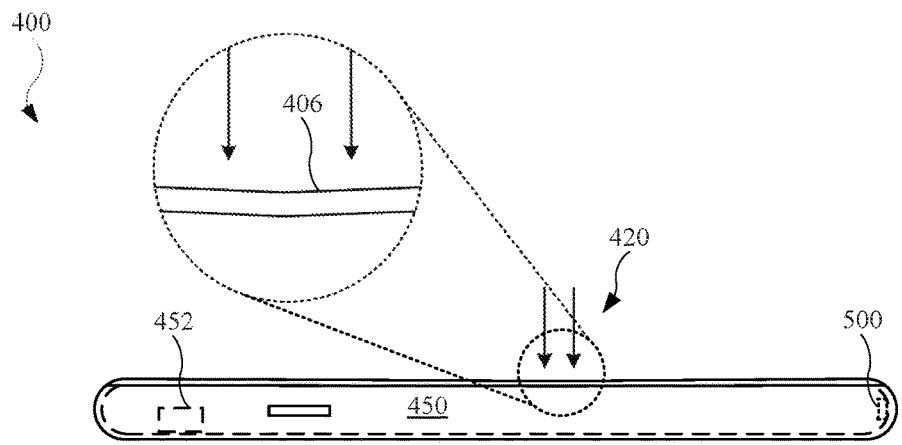
FIG. 11 illustrates a side view of the electronic device shown in FIG. 9, further showing an increased force applied to the protective layer.

FIG. 11 illustrates a side view of the electronic device 400 shown in FIG. 9, further showing an increased force 420 applied to the protective layer 406. The increased force 420 may represent a user depressing a display assembly (not shown) that includes a force sensitive layer (not shown) in the electronic device 400, with the force sensitive layer designed to determine an amount of force applied to the protective layer 406, and in turn, to the touch screen or display assembly (not shown). As shown in the enlarged view, the increased force 420 causes additional bending of the protective layer 406, which causes a further decrease in the internal volume 450. Accordingly, as a result of the increased force 420 (as compared to the force 410, shown in FIG. 9), the volume of air in the electronic device 400 is further decreases, causing the air pressure to further increase. However, the vent assembly 500 in the electronic device 400 is designed allow the internal air pressure to quickly equilibrate with ambient air by opening a valve and allowing at least some of the air inside the electronic device 400 to evacuate to exit the electronic device 400. This will be shown below. As a result the aforementioned valve opening, the increased internal air pressure can be quickly reduced so that the internal component 452 is not disturbed.

Figure 12:
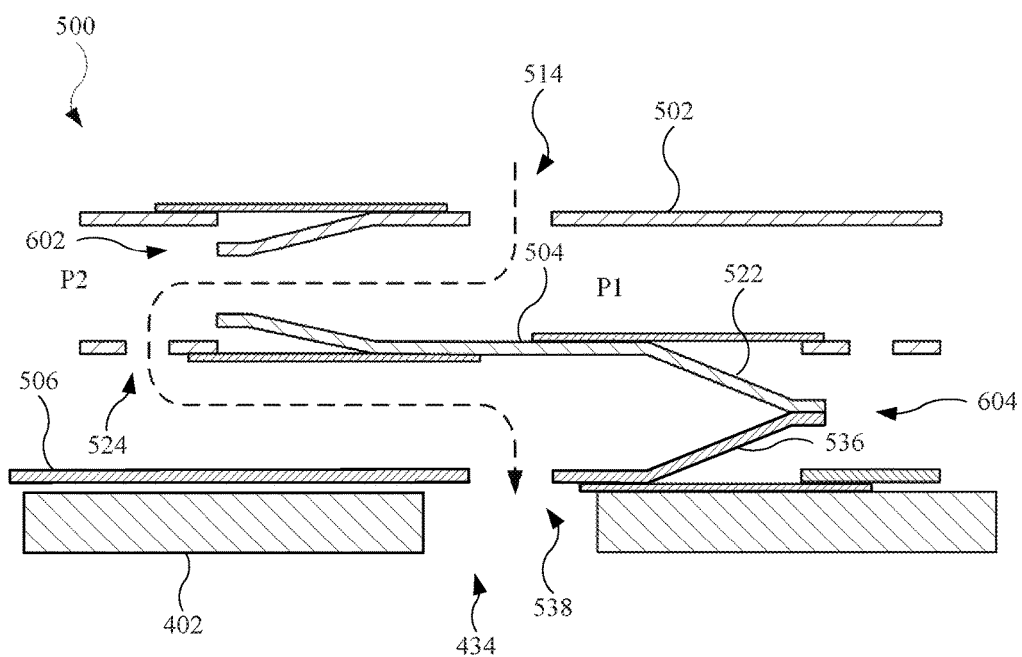
FIG. 12 illustrates a cross sectional view of the vent assembly shown in FIG. 11, showing air entering the vent assembly and passing through the first valve.

FIG. 12 illustrates a cross sectional view of the vent assembly 500 shown in FIG. 11, showing air entering the vent assembly 500 and passing through the first valve 602. As shown, the vent assembly 500 may further include a second opening 524 formed in the second layer 504, as well as an opening 538 formed in the third layer 506, with the opening 538 in the third layer 506 aligned with the opening 434 of the enclosure 402.

As the internal volume 450 decreases (as shown in FIG. 11), the pressure inside the electronic device 400 may be greater than that of ambient air, which may cause air to exit the electronic device 400 by way of the vent assembly 500. For example, the increased internal air pressure inside the electronic device 400 may create a pressure differential between P1 (internal pressure) and P2 (external/ambient pressure) sufficiently large enough overcome the forces holding together the flaps of the first valve 602, thereby causing the first valve 602 to open. As a result, the air flows through the first valve 602 and through the second opening 524 as well as the opening 538 in a third layer 506, and then the opening 434 of the enclosure 402. This process allows the internal air pressure to equalize with the external/ambient air pressure. Also, FIG. 12 shows the vent assembly 500 including a second valve 604 formed from a third flap 522 and a fourth flap 536 of the second layer 504 and the third layer 506, respectively. The second valve 604 may provide a one-way valve that prevents air entering the vent assembly 500 via the first opening 514 from reaching the opening 538. This will be shown and discussed below.

Figure 13:
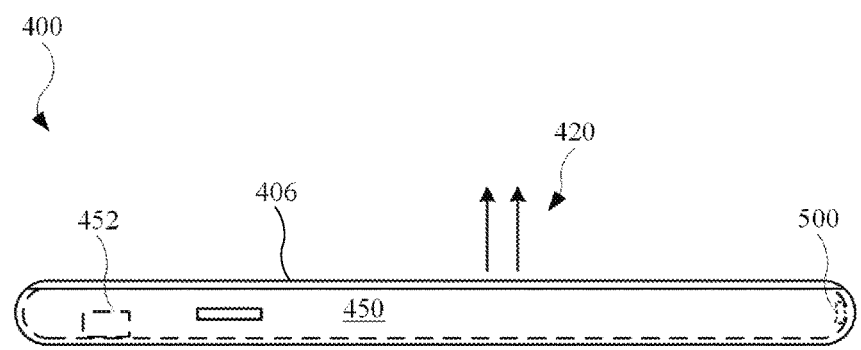
FIG. 13 illustrates a side view of the electronic device shown in FIG. 11, further showing the increased force removed from the protective layer.

FIG. 13 illustrates a side view of the electronic device 400 shown in FIG. 11, further showing the increased force 420 removed from the protective layer 406. The arrows illustrating the increased force 420 are shown in the opposite direction (as compared to FIG. 11) to denote the change in direction of the increased force 420. The removal of the increased force 420 to the protective layer 406 may be associated with a user removing the force from the protective layer 406, by for example, removing a digit, such as a finger or thumb (not shown), from the protective layer 406. The removal of the increased force 420 causes the protective layer 406 to unbend and return to its original, unbent configuration (as compared to FIG. 11, which shows a bent configuration). As a result, the internal volume 450 increases to its original internal volume, causing the internal air pressure in the internal volume 450 to decrease. The decreased internal air pressure caused by the removal of the increased force 420 may also disturb the internal component 452 unless the internal air pressure increases in a relatively quick manner. In this regard, the vent assembly 500 is designed to allow the internal air pressure to quickly equilibrate with ambient air by allowing ambient air into the internal volume 450. This will be shown below.

Figure 14:
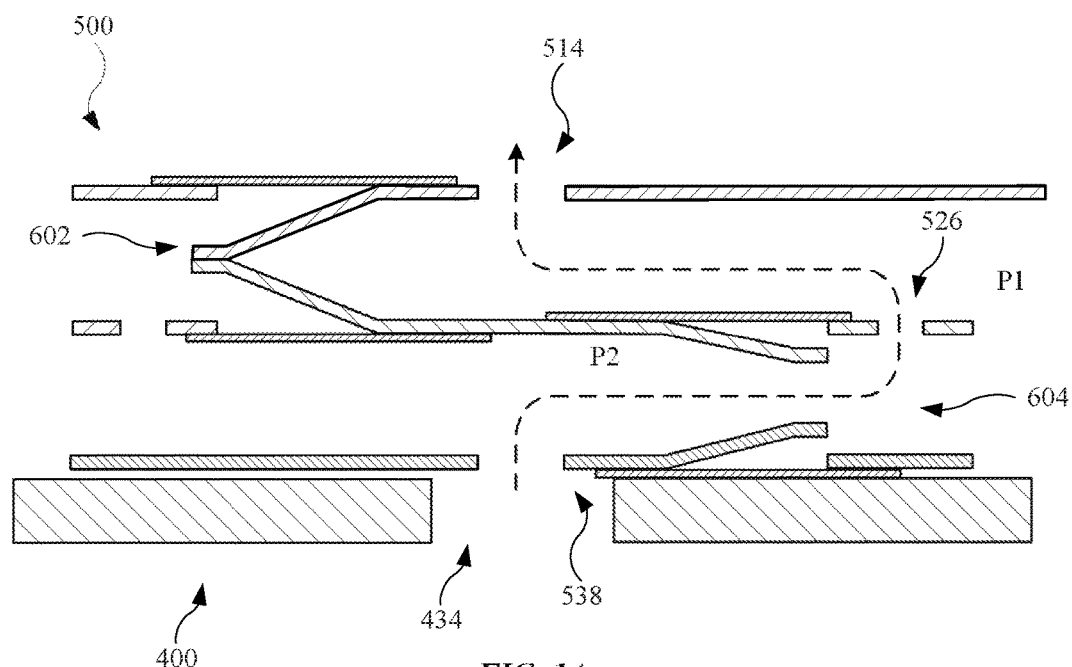
FIG. 14 illustrates a cross sectional view of the vent assembly shown in FIG. 13, showing air entering the vent assembly and passing through the second valve.

FIG. 14 illustrates a cross sectional view of the vent assembly 500 shown in FIG. 13, showing air entering the vent assembly 500 and passing through the second valve 604. As shown, the second layer 504 may include an opening 526 formed in the second layer 504. As the internal volume 450 increases (as shown in FIG. 13), the air pressure inside the electronic device 400 may be less than that of ambient air outside the electronic device 400, which in some cases causes air to enter the electronic device 400 by way of the vent assembly 500. The decreased internal air pressure in the electronic device 400 may create a pressure differential between P2 (external/ambient pressure) and P1 (internal pressure) to overcome the forces holding together the flaps of the second valve 604. As a result, the second valve 604 opens and allows air to pass through the second valve 604 and the opening 526, as well as the first opening 514 of the first layer 502. Accordingly, the vent assembly 500 allows air into the internal volume 450 (shown in FIG. 13) of the electronic device 400 such that the internal air pressure equalizes with the external/ambient air pressure. Also, the first valve 602 may provide a one-way valve that prevents air entering the vent assembly 500 via the opening 538 from reaching the first opening 514.

The vent assembly 500 described in FIGS. 9-14 provides bi-directional airflow using two one-way valves (the first valve 602 shown in FIG. 12, and the second valve 604 shown in FIG. 14), with each valve designed to regulate airflow in different directions. As shown and described, the first valve 602 regulates air exiting the electronic device 400, while the second valve 604 regulates air entering the electronic device 400. Also, the process described in the FIGS. 9-14 is intended to occur relatively quickly (on the order of 0.25 seconds or less) and in accordance with a user interaction (such as depressing the protective layer 406 to provide a touch input). Accordingly, the vent assembly 500, and other vent assemblies described herein, are intended to work quickly to prevent damage or disturbance to internal components (such as a speaker module) in an electronic device that are sensitive to rapid pressure changes.

Also, some embodiments describe vent assembly as having three layers. However, in some instances, a vent assembly may include two layers that combine to form two valves that provide the vent assembly with bi-directional airflow regulation. Also, in some instances, at least some of the valves are arranged in a valve assembly such that two or more valves share the same opening of the vent assembly. Also, in some instances, the valve assembly includes two adjacent layers, with each layer having multiple capacitor plates to form several parallel plate capacitors, and with one of the two layers carrying an electrical charge on the capacitor plates. In this regard, when a portion of one layer moves relative to another layer, the capacitance of some of the capacitors changes in a location corresponding to that portion, due in part to a change in voltage of the capacitor plates that carry an electrical charge. This change may correspond to pressure changes, which can be input to a processor in an electronic device to determine the pressure applied to the vent assembly. As a result, the pressure inside the electronic device may be monitored electronically, and commands (in the form of electrical signals) can be used to open or close one or more valves.

Figure 15:
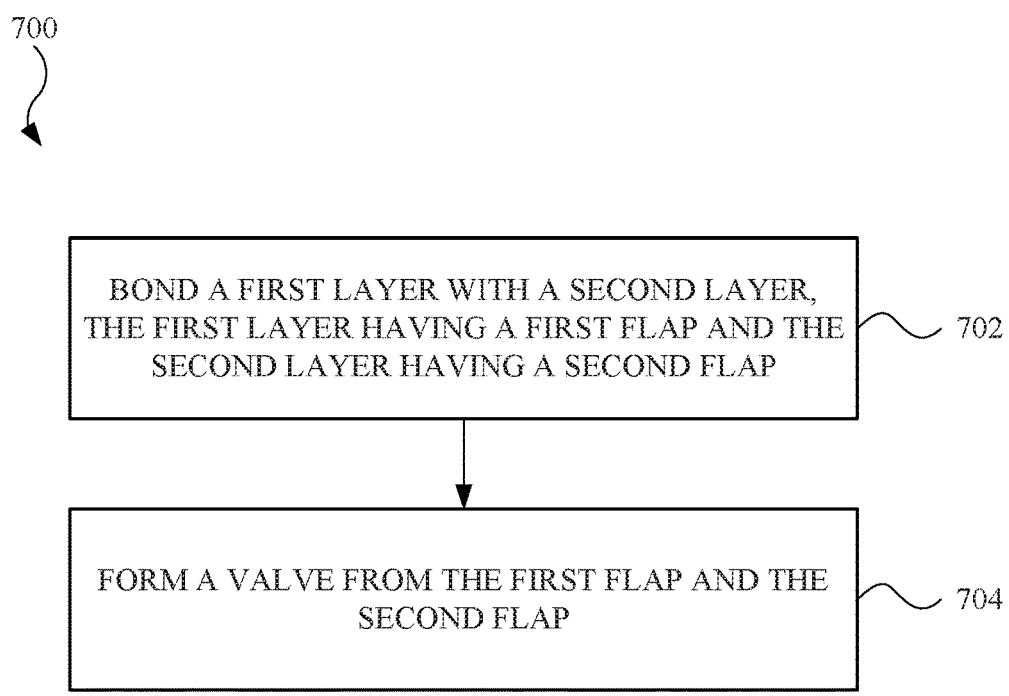
FIG. 15 illustrates a flowchart showing a method for forming a vent assembly in an electronic device, in accordance with some described embodiments.

FIG. 15 illustrates a flowchart 700 showing a method for forming a vent assembly in an electronic device, in accordance with some described embodiments. The method may form a bi-directional vent assembly that includes at least two valves. Each valve may define a one-way valve. Also, each valve may allow airflow to pass only in different (including opposing) directions. For example, a first valve may allow airflow (through the first valve) in a first direction but not a second (opposite) direction, while a second valve may allow airflow (through the second valve) in the second direction but not the first direction.

In step 702, a first layer is bonded with a second layer. The bonding techniques may include, as non-limiting examples, welding, gluing, and melting. A bonding operation may occur in multiple areas to ensure airflow is directed to, and not around, valves formed by flaps. The first layer may include a first flap and a second layer may include a second flap. Optionally, a similar process may be used to form additional valves. Further, additional layers having a flap may also be used. Also, each of the layers may include an air-resistant and a liquid-resistant material, such as a polyamide or PET.

In step 704, a valve is formed from the first flap and the second flap. In some instances, the valve defines a first value of the valve assembly. The valve may be designed to open based on exposure to a predetermined pressure differential between air pressures on opposing sides of the first valve. Also, the first valve may include a one-way valve that allows air to flow in a first direction through the valve when the first valve is open, and prevents air from flowing in a second direction when the valve is closed. Optionally, a second valve may be formed using a third layer that is bonded to the second layer. In this manner, the second layer may include a third flap, and the third layer may include a fourth flap that combines with the third flap to form a second valve. Similar to the first valve, the second valve may be designed to open based on exposure to a predetermined pressure differential between air pressures on opposing sides of the valve. However, the second valve may include a one-way valve that allows air to flow in the second direction through the second valve when the second valve is open, and prevents air from flowing in the first direction when the valve is closed. Also, each flap may include a rectilinear shape. However, other shapes, such as a tapered shape, are possible.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A vent assembly for regulating air within an electronic device, the electronic device having an enclosure that defines an internal volume that carries the air at an internal air pressure, the enclosure further comprising a through hole that provides a passage between the air internal volume and an ambient environment that is external to the electronic device, the ambient environment having an external air pressure, the vent assembly comprising:
   a first layer disposed in the internal volume, the first layer having a first flap and an opening;
   a second layer disposed in the internal volume and bonded with the first layer, the second layer having a second flap; and
   a valve formed from the first flap and the second flap, wherein the first flap is held together with the second flap by a compressive force defining a closed state of the valve, and wherein a difference between the internal air pressure and the external air pressure that is greater than the compressive force causes the first flap to separate from the second flap defining an open state of the valve, the open state allowing the air to pass from the internal volume to the ambient environment.

2. The vent assembly of claim 1, further comprising a third layer bonded with the second layer, wherein:
   the second layer includes a third flap,
   the third layer includes a fourth flap, and
   a second valve formed from the third flap and the fourth flap, wherein the third flap is held together with the fourth flap by a second compressive force defining a second closed state of the second valve, and wherein a difference between the external air pressure and the internal air pressure is greater than the compressive force, the third flap separates from the fourth flap defining a second open state different from the second closed state, the second open state allowing air from the ambient environment to the internal volume.

3. The vent assembly of claim 2, wherein:
   the opening in the first layer defines a first opening;
   the second layer includes a second opening and a third opening; and
   the third layer includes a fourth opening that aligns with the through hole.

4. The vent assembly of claim 3, wherein:
   when the valve is in the open state, the air passes through the first opening, the second opening, and the fourth opening to exit the enclosure via the through hole, and
   when the second valve is in the open state, the air from the ambient environment passes through the through hole, the third opening, and the first opening to enter the enclosure.

5. The vent assembly of claim 2, wherein the valve prevents the air from the ambient environment from entering the internal volume, and wherein the second valve prevents the air from exiting the internal volume.

6. The vent assembly of claim 2, wherein the first layer, the second layer, and the third layer include an air-resistant and a liquid-resistant material.

7. The vent assembly of claim 2, wherein in a closed configuration, the first layer is positioned on the second layer and the second layer is positioned on the third layer, and wherein in an open configuration different from the closed configuration, the first layer is separated from the second layer and the second layer is separated from the third layer.

8. The vent assembly of claim 1, wherein the valve opens in response to a predetermined pressure differential between the internal air pressure and the external air pressure.

9. An electronic device, comprising:
   an enclosure that defines an internal volume that carries internal air, the enclosure having through hole; and
   a vent assembly positioned in the internal volume and covering the through hole, the vent assembly comprising:
      a first valve that regulates the internal air exiting the enclosure, and
      a second valve that regulates external air entering the enclosure via the through hole.

10. The electronic device of claim 9, wherein the first valve permits the internal air to pass only in a first direction in accordance with exiting the enclosure, and wherein the second valve permits the external air to pass only in a second direction in accordance with entering the enclosure.

11. The electronic device of claim 9, wherein the vent assembly comprises:
   a first layer having a first flap; and
   a second layer having a second flap that combines with the first flap to form the first valve, the second layer further comprising a third flap; and
   a third layer having a fourth flap that combines with the third flap to form the second valve.

12. The electronic device of claim 11, wherein:
   the first layer includes a first opening that receives the internal air;
   the second layer includes:
      a second opening that receives the internal air when the first valve opens,
      and a third opening that receives the external air when the second valve opens; and
   the third layer includes a fourth opening aligned with the through hole.

13. The electronic device of claim 11, wherein the first layer is bonded with the second layer by a first bond, and wherein the second layer is bonded with the third layer by a second bond.

14. The electronic device of claim 11, wherein the first layer separates from the second layer when the first valve is open, and wherein the second layer separates from the third layer when the second valve is open.

15. The electronic device of claim 9, wherein the first valve includes a first one-way valve that allows the internal air to pass through the vent assembly in a first direction, and wherein the second valve includes a second one-way valve that allows the external air to pass through the vent assembly in a second direction that is different from the first direction.

16. A method for forming a vent assembly in an electronic device, the electronic device having an enclosure that includes a through hole, the method comprising:
   bonding a first layer with a second layer, the first layer having a first flap and an opening, the second layer having a second flap; and
   forming a valve from the first flap and the second flap, the valve opening when air in the enclosure undergoes a pressure increase and enters the opening to allow the air to exit the enclosure via the through hole.

17. The method of claim 16, further comprising bonding a third layer with the second layer such that the second layer is between the first layer and the second layer, the second layer having a third flap and the third layer having a fourth flap that combines with the third flap to form a second valve that opens when the air in the enclosure undergoes a pressure decrease to allow external air to enter the enclosure via the through hole.

18. The method of claim 17, wherein the valve regulates the air in a first direction between the first layer and the second layer, and wherein the second valve regulates the air in a second direction between the second layer and the third layer, the second direction opposite the first direction.

19. The method of claim 17, further comprising:
   forming a first opening in the first layer;
   forming a second opening and a third opening in the second layer; and
   forming a fourth opening in the third layer, wherein the fourth opening is aligned with the through hole.

20. The method of claim 19, wherein:
   when the valve opens, the air passes through the first opening, the second opening, and the fourth opening to exit the enclosure via the through hole, and
   when the second valve opens, the external air passes through the through hole, the third, opening, and first opening to enter the enclosure.

* * * * *